United States Patent
Coronato et al.

(10) Patent No.: US 9,897,460 B2
(45) Date of Patent: Feb. 20, 2018

(54) METHOD AND SYSTEM FOR QUADRATURE ERROR COMPENSATION

(71) Applicant: Maxim Integrated Products, Inc., San Jose, CA (US)

(72) Inventors: Luca Coronato, Corsico (IT); Gabrielle Cazzaniga, Rosate (IT); Carlo Caminada, Pregnana Milanese (IT); Manuel Santoro, Milan (IT); Luciano Prandi, Bellinzago Novarese (IT); Demetre Kondylis, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 189 days.

(21) Appl. No.: 14/733,726

(22) Filed: Jun. 8, 2015

(65) Prior Publication Data
US 2015/0268060 A1 Sep. 24, 2015

Related U.S. Application Data

(63) Continuation of application No. 13/481,391, filed on May 25, 2012, now Pat. No. 9,052,335.

(30) Foreign Application Priority Data

May 26, 2011 (EP) .................................... 11004355

(51) Int. Cl.
*G01P 21/00* (2006.01)
*G01C 25/00* (2006.01)
(Continued)

(52) U.S. Cl.
CPC .............. *G01C 25/005* (2013.01); *B81B 7/02* (2013.01); *G01C 19/56* (2013.01); *G01P 21/00* (2013.01); *B81B 2201/0242* (2013.01)

(58) Field of Classification Search
CPC ........ G01P 21/00; G01P 15/125; G01P 15/18; G01C 25/005; G01C 25/00
(Continued)

(56) References Cited

U.S. PATENT DOCUMENTS

| | | |
|---|---|---|
| 5,400,269 A | 3/1995 | White et al. |
| 6,067,858 A | 5/2000 | Clark et al. |

(Continued)

FOREIGN PATENT DOCUMENTS

| | | |
|---|---|---|
| CN | 1898528 A | 1/2007 |
| CN | 101799479 A | 8/2010 |

(Continued)

OTHER PUBLICATIONS

Office Action dated Feb. 1, 2016, in Chinese Patent Application No. 201210168238.6 (10pgs).

(Continued)

*Primary Examiner* — Eric S McCall
*Assistant Examiner* — Mohammed E Keramet-Amircolai
(74) *Attorney, Agent, or Firm* — North Weber & Baugh LLP (57) ABSTRACT

The present invention concerns an MEMS sensor and a method for compensation of a quadrature error on an MEMS sensor, which is intended for detection of movements of a substrate, especially accelerations and/or rotation rates. At least one mass arranged on the substrate and mounted to move relative to it is driven by means of drive electrodes. The mass/es execute a movement deviating from the prescribed movement due to a quadrature error. A deflection of the mass/es occurring due to Coriolis force and quadrature error is detected with detection electrodes. It is proposed according to the invention that a capacitance change be detected as a function of drive movement of the mass/es by means of compensation electrodes. A compensation charge (Continued)

dependent on the quadrature error of the MEMS sensor is generated on the compensation electrodes. For compensation, the distorted or incorrect charge generated by the quadrature error in the detection electrodes is compensated with the compensation charge.

18 Claims, 5 Drawing Sheets (51) Int. Cl.
   *G01C 19/56* (2012.01)
   *B81B 7/02* (2006.01)
(58) Field of Classification Search
   USPC .......................................................... 73/1.38
   See application file for complete search history.

(56) References Cited

U.S. PATENT DOCUMENTS

| | | | |
|---|---|---|---|
| 7,290,435 | B2 | 11/2007 | Seeger et al. |
| 7,707,885 | B2 | 5/2010 | Beitia |
| 8,215,151 | B2 | 7/2012 | Sammoura et al. |
| 2003/0151394 | A1 | 8/2003 | Mohaupt et al. |
| 2006/0213265 | A1 | 9/2006 | Weber et al. |
| 2007/0056370 | A1* | 3/2007 | Braman .................. G01P 1/023 73/514.07 |
| 2007/0193353 | A1* | 8/2007 | Kim ....................... G01C 19/56 73/514.29 |
| 2010/0132461 | A1 | 6/2010 | Hauer et al. |
| 2011/0167891 | A1* | 7/2011 | Geen ..................... G01C 25/005 73/1.38 |
| 2012/0096943 | A1* | 4/2012 | Potasek .................. G01C 19/56 73/504.14 |
| 2012/0272711 | A1* | 11/2012 | Supino ................. G01C 25/005 73/1.38 |
| 2013/0031948 | A1 | 2/2013 | Lignon et al. |
| 2013/0199263 | A1* | 8/2013 | Egretzberger ......... G01C 19/56 73/1.38 |
| 2013/0269413 | A1 | 10/2013 | Tao et al. |

FOREIGN PATENT DOCUMENTS

| | | |
|---|---|---|
| DE | 19939998 A1 | 3/2001 |
| DE | 10360963 A1 | 7/2005 |
| DE | 102004061804 A1 | 7/2006 |
| EP | 1752733 A2 | 2/2007 |
| JP | 2006177963 A | 7/2006 |

OTHER PUBLICATIONS

Search Report dated Mar. 4, 2013, in related German Application No. 102012104358.2.
Response as filed Dec. 12, 2016, in Chinese Patent Application No. 201210168238.6, and English translation of current claims.
Office Action dated Sep. 26, 2016, in Chinese Patent Application No. 101210168238.6, and English Translation of same (6pgs).
Response filed Jun. 15, 2016, English translation of marked-up claims and clean version of claims as filed in Chinese Patent Application No. 2012101682386 (12pgs).

* cited by examiner

METHOD AND SYSTEM FOR QUADRATURE ERROR COMPENSATION

CROSS REFERENCE TO RELATED APPLICATIONS

This application is a continuation of U.S. patent application Ser. No. 13/481,391, filed May 25, 2012, which application claims priority under 35 U.S.C. § 119 to EP Patent Application No. 11004355.1, filed May 26, 2011, which application are hereby incorporated herein in their entireties.

BACKGROUND

A. Technical Field

Specific embodiments of the invention pertain to gyroscopes or gyroscope devices and/or methods and systems for quadrature error compensation, for example, in gyroscopes or gyroscope devices.

B. Background of the Invention

A problem to be solved exists in gyroscope devices in the occurrence of quadrature errors. A quadrature error, for example, can be an interfering signal superimposed on a useful rotation rate signal.

Quadrature errors are caused by inaccuracies and asymmetries in the geometry of the moving mass of the gyroscope. The amplitude of such a quadrature error can be 10 to 100 times the typical gyroscope full deflections.

The quality of the gyroscope device is influenced by the quadrature error, for example, in the following parameters:
 dynamic range of the charge amplifier
 output noise and/or
 temperature deviations of the null rate level.

Methods and devices for compensation of quadrature errors are known, for example, from documents U.S. Pat. No. 6,067,858, EP1752733A2, US2006/0213265A1 and US 2010/0132461A1. It is proposed in all these documents to influence the real movement of the driven mass, which might deviate from the ideal movement because of quadrature error of the sensor, so that it corresponds as much as possible to the ideal movement.

Additional restrictions and shortcomings of conventional and traditional approaches are disclosed to one with average skill in the art by a comparison of such methods and systems with some aspects of the present invention, as are described in the rest of the present application and the drawings.

SUMMARY OF THE INVENTION

The present invention concerns a method for compensation of a quadrature error on an MEMS sensor, which is intended to detect movements of a substrate, especially accelerations and/or rotation rates. At least one mass arranged on the substrate and mounted to move relative to it is driven by means of drive electrodes. The mass/es execute a movement deviating from the prescribed movement owing to a quadrature error. A deflection of the mass/es occurring because of Coriolis force and quadrature error is detected with detection electrodes.

The quadrature error caused, for example, by small design tolerances in production of the sensor and/or non-uniform temperature expansion means that the moving mass deviates from its ideal theoretically stipulated movement direction. Signals are generated in the detection electrodes because of this, which overlap the signals for detecting accelerations or rotation rates of the sensor and prevent correct detection.

It is proposed according to the invention that a capacitance change be detected as a function of the drive movement of the mass/es by means of compensation electrodes. A compensation charge dependent on the quadrature error of the MEMS sensor, especially proportional to the quadrature error, is generated on the compensation electrodes. The distorted or incorrect charge generated in the detection electrodes by the quadrature error is compensated with the compensation charge for compensation.

It is essential here that the compensation charge be added only to the detected distorted or incorrect charge without changing the deviating movement of the mass/es caused by the quadrature error. The incorrect movement is retained and only compensation of the detected charge occurs with the compensation charge. In contrast to this, it is always proposed in the prior art that the movement of the mass be influenced so that it largely corresponds to the ideal movement and a more or less correct signal is generated on the detection electrodes. In the present invention, on the other hand, neither the movement of the mass nor the charge on the detection electrodes is influenced by compensation. Compensation only occurs later, namely after detection of the incorrect signal. The incorrect signal is compensated and not the movement of the mass.

It is particularly advantageous if the charge generated in the detection electrodes by the quadrature error and the compensation charge essentially fully cancel each other out. The effect of the quadrature error is therefore completely eliminated and the most accurate measurement result is obtained.

To generate a compensation charge a predetermined voltage dependent on the quadrature error of the MEMS sensor is advantageously applied to the compensation electrodes.

If the compensation charge and the charge of the detection electrodes in an advantageous embodiment of the invention are superimposed one on the other, a new signal consisting of both signals is present, which has compensated for the quadrature error and corresponds to a virtual ideal movement.

If the already superimposed charge in an advantageous embodiment is fed to evaluation electronics, charge signals that compensate for the actual movement deviation of the mass and therefore simulate an ideal movement are sent to the evaluation electronics assigned to the sensor. The compensation charge and the fraction of the detected charge caused by the quadrature error mutually cancel each other out so that only the value that would be detected during an ideal movement is sent. The evaluation device or electronics in this case merely reports an already compensated signal.

In another advantageous embodiment of the invention both the compensation charge and the charge of the detection electrodes are fed to evaluation electronics and further processed there. Superposition therefore only occurs in this evaluation electronics. The evaluation electronics or device in this case receives the signal of the compensation charge, on the one hand, and also the signal of the actually detected detection charge. The two signals are then further processed in the electronics to compensate for the quadrature error.

It is particularly advantageous that the compensation charge is regulated as a function of quadrature error. Regulation can directly act on an altered quadrature error and change the compensation signal accordingly. This is advantageous in extremely precisely operating sensors or sensors that might change over time, for example, from extreme temperature changes, which influence the quadrature error.

If the quadrature error of the MEMS sensor and/or the voltage dependent on the quadrature error in an advantageous embodiment is determined right after production of the MEMS sensor, the error present for this special MEMS sensor can be established very simply and a fixed compensation voltage incorporated for this error.

The quadrature error of the MEMS sensor and/or the voltage dependent on the quadrature error is advantageously determined during operation of the MEMS sensor. The compensation voltage could then be changed, as required, for example, when a fixed tolerance is surpassed.

An MEMS sensor according to the invention is used to detect movements of a substrate, especially accelerations and/or rotation rates. It has a substrate and at least one mass arranged on the substrate and at least one mass mounted to move relative to this substrate and driven by means of drive electrodes. At least one fixed detection electrode is arranged on the substrate, which cooperates with at least one electrode arranged on the mass to detect a deflection of the mass due to Coriolis force and a quadrature error. A device for compensation of the quadrature error is also provided. The device for compensation of the quadrature error has at least one compensation electrode arranged fixed on the substrate, which cooperates with at least one electrode arranged on the mass to detect a capacitance change as a function of the drive movement of the mass/es. A voltage source is also provided, which applies a predetermined voltage dependent on the quadrature error to the compensation electrodes to generate a compensation charge. Moreover, a connection exists between the compensation electrodes and the detection electrodes and/or the compensation electrodes and an evaluation device to compensate for the charge generated by the quadrature error in the detection electrode with the compensation charge. The detection electrodes and an evaluation device are also connected to each other in order to be able to send their signals to the evaluation device or electronics.

The MEMS sensor is equipped accordingly so that it can send either a single already compensated signal or a specified charge of the electrodes to the evaluation electrodes. As an alternative or in addition it sends two signals to the evaluation electronics, namely a signal of the compensation device, on the one hand, and a signal of the detection electrodes, on the other, which is still distorted because of a quadrature error.

If the evaluation device or electronics has a regulation device, the MEMS sensor can advantageously be operated very precisely. Changes occurring during operation of the sensor and which can have an effect on the quadrature error are also allowed for by this. Compensation of the quadrature error can therefore be modified and adapted.

The MEMS sensor is advantageously a one- or multidimensional sensor. Both one- or multidimensional acceleration sensors and also one- or multidimensional rotation rate sensors or combinations thereof can be equipped with quadrature error compensation according to the invention. A compensation device is preferably provided for each detection dimension being compensated. However, compensation devices that produce a compensation signal for several dimensions can also be arranged on the MEMS sensor.

The electrodes of the compensation device are advantageously provided to detect and evaluate the drive movement and/or to drive the mass/es. A very compact and relatively inexpensive sensor can therefore be created.

A system and/or method are proposed for quadrature error compensation, especially as shown and/or described in conjunction with at least one of the figures and also in the claims. These and other advantages, aspects and new features of the present invention, as well as details of a practical example of this, are further explained in the following description and drawings.

BRIEF DESCRIPTION OF THE DRAWINGS

FIG. ("FIG.") 1 is a depiction showing how a quadrature error occurs in a capacitive gyroscope.

DETAILED DESCRIPTION OF THE PREFERRED EMBODIMENTS

Specific embodiments of the invention can be found in a method and system for quadrature error compensation, for example, in but not restricted to gyroscope devices.

Figure 1:
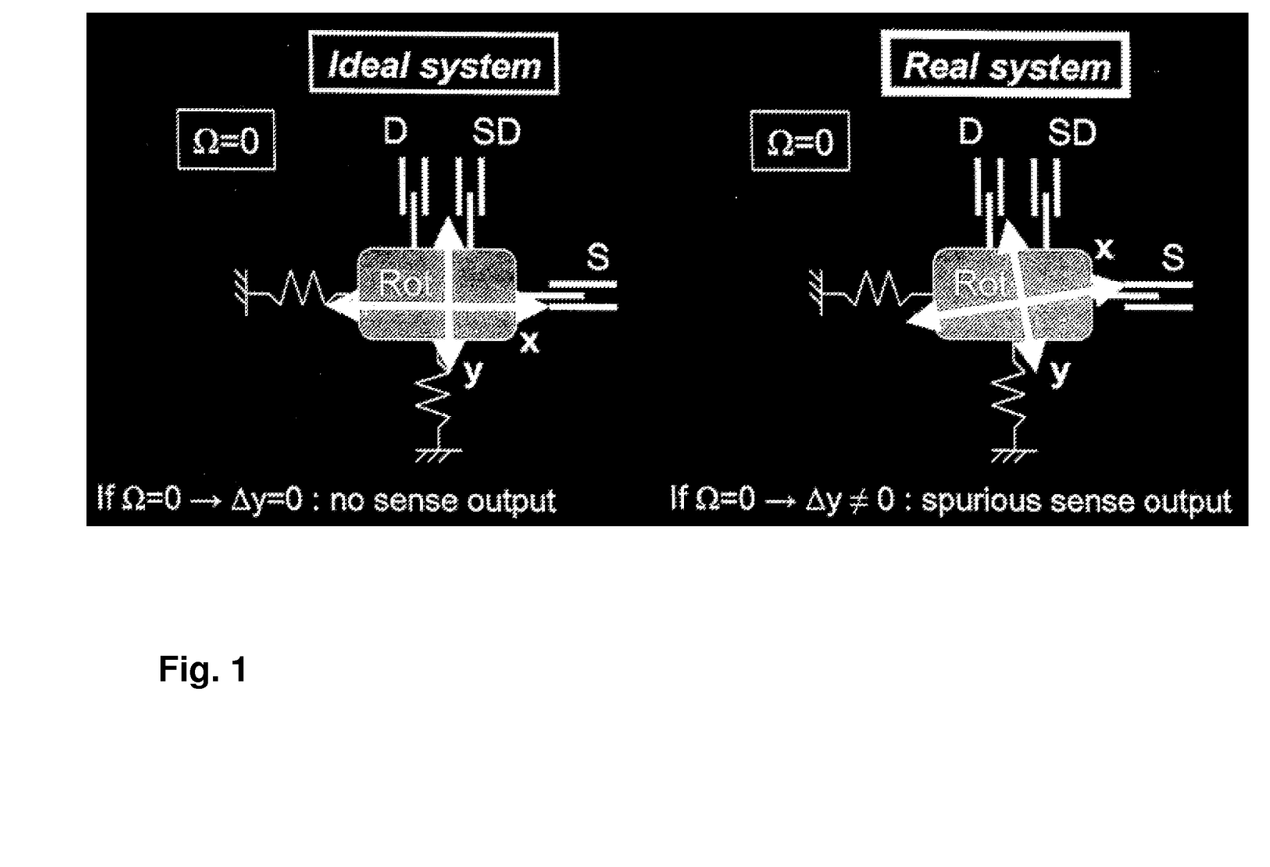

FIG. 1 is a depiction showing how a quadrature error occurs in a capacitive gyroscope.

"Rot" in FIG. 1 denotes the rotor or moving mass, "D" the drive electrodes, "SD" or "$S_{2a}$" and "$S_{2b}$" the drive detection electrodes, "S" the detection electrodes, "Ω" the rotation rate, "x" the drive device and "y" the detection device. The rotor "Rot" is mounted to move on a substrate "Sub" by means of springs "F". The electrodes "D", "SD" and "$S_{2a}$" and "$S_{2b}$" can serve as compensation electrodes, since they can detect the movement of the mass Rot, to which the quadrature error is proportional.

As is apparent from FIG. 1, an ideal system is present if Ω=0 and Δy=0. No detection output is then present.

In contrast to this, in a real system, if Ω=0, Δy≠. An interfering detection output signal then occurs.

Figure 2:
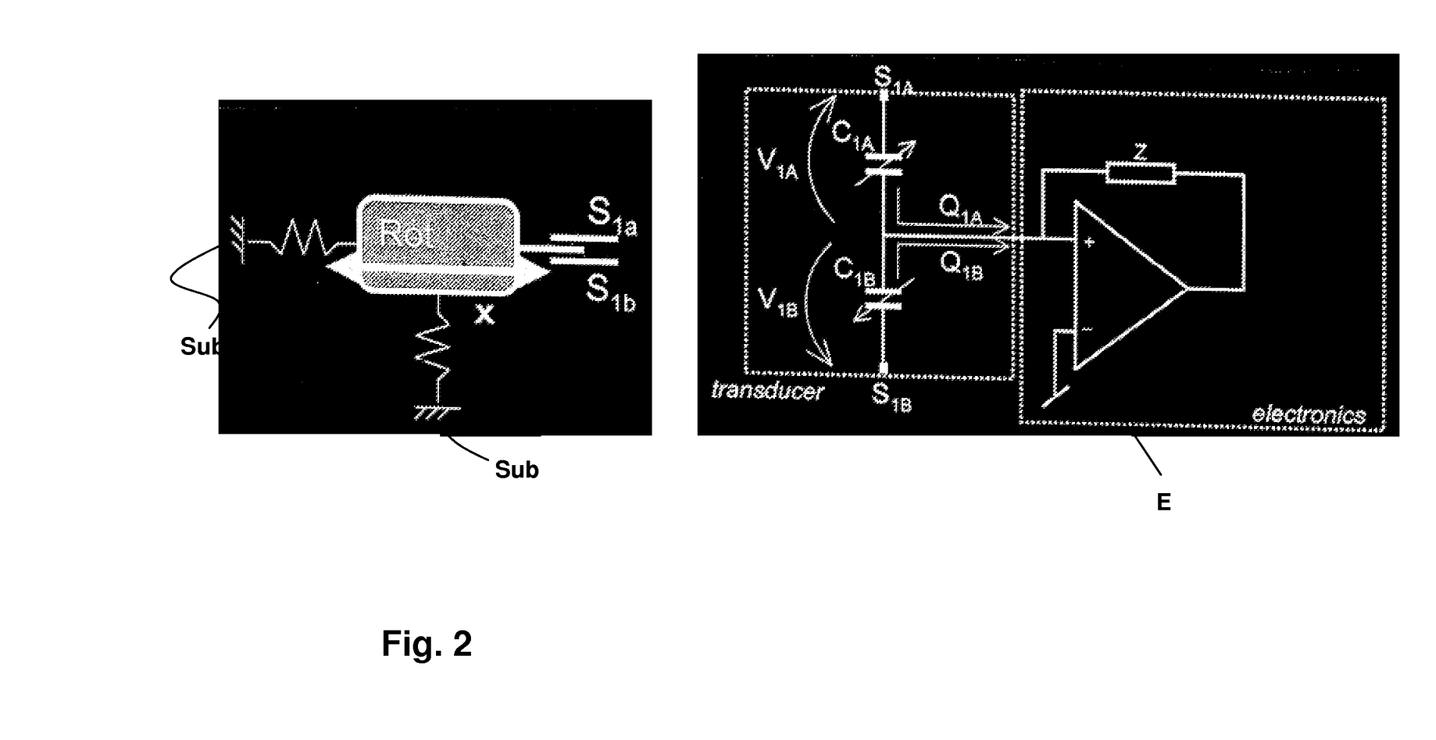
FIG. 2 is a depiction showing how detection is read out.

FIG. 2 shows a depiction of a detection output, especially for the real and ideal system as shown in FIG. 1.

As shown in FIG. 2, the corresponding drive movement $X=X_0*\sin(\omega t)$.

The quadrature error has almost the same phase as the drive movement, whereas the rotation rate signal has the same phase as the drive speed. The quadrature error causes a movement of the drive mass deviating from the ideal, linear drive movement, for example, yawing.

As also follows from FIG. 2, a charge amplifier is used, with which charges that are generated in the rotor are read out in an electronic interface (E).

The detection output in the ideal system by the rotor (Rot) is only dependent on a rotation rate signal:

$$C_{1a} = C_0 + \Omega*\cos(\omega t)$$

$$Q1a = (C0 + \Omega*\cos(\omega t))*V1a$$

$$C_{1b} = C_0 - \Omega*\cos(\omega t)$$

$$Q1b = (C0 - \Omega*\cos(\omega t))*V1b$$

In contrast to this, in a real system:

$$C_{1a} = C_0 + \text{Quad}*\sin(\omega t) + \Omega*\cos(\omega t)$$

$$C_{1a} = (C_0 + \text{Quad}*\sin(\omega t) + \Omega*\cos(\omega t))*V_{1a}$$

$$C_{1b}=C_0-\text{Quad}*\sin(\omega t)-\Omega*\cos(\omega t)$$

$$Q_{1b}=(C_0-\text{Quad}*\sin(\omega t)-\Omega*\cos(\omega t))*V_{1b}$$

Here "$\omega$" denotes the drive frequency, "$C_0$" the static capacitance on the detection electrodes $S_1$, "Quad" the capacitance deviation due to the quadrature error and "$\Omega$" the capacitance deviation due to the rotation rate.

Figure 3:
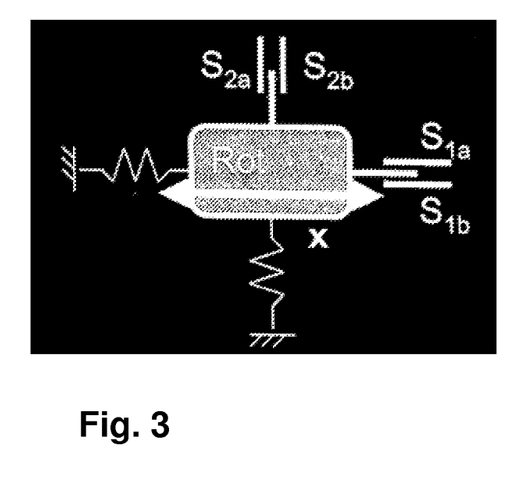
FIG. 3 is a depiction showing a proposed solution for quadrature signal compensation in conjunction with a practical example of the invention.

FIG. 3 is a depiction of a proposed solution for quadrature error compensation in conjunction with an embodiment of the invention.

In the proposed solution the quadrature signal charge, which is generated by the interfering detection movement on the rotor, is compensated by generation of an opposite charge, in which an additional pair of electrodes ($S_{2a}$, $S_{2b}$) is used. To generate a signal that is capable of compensating the quadrature with this method, the capacitance on the electrodes must be varied only with the drive movement.

Figure 4:
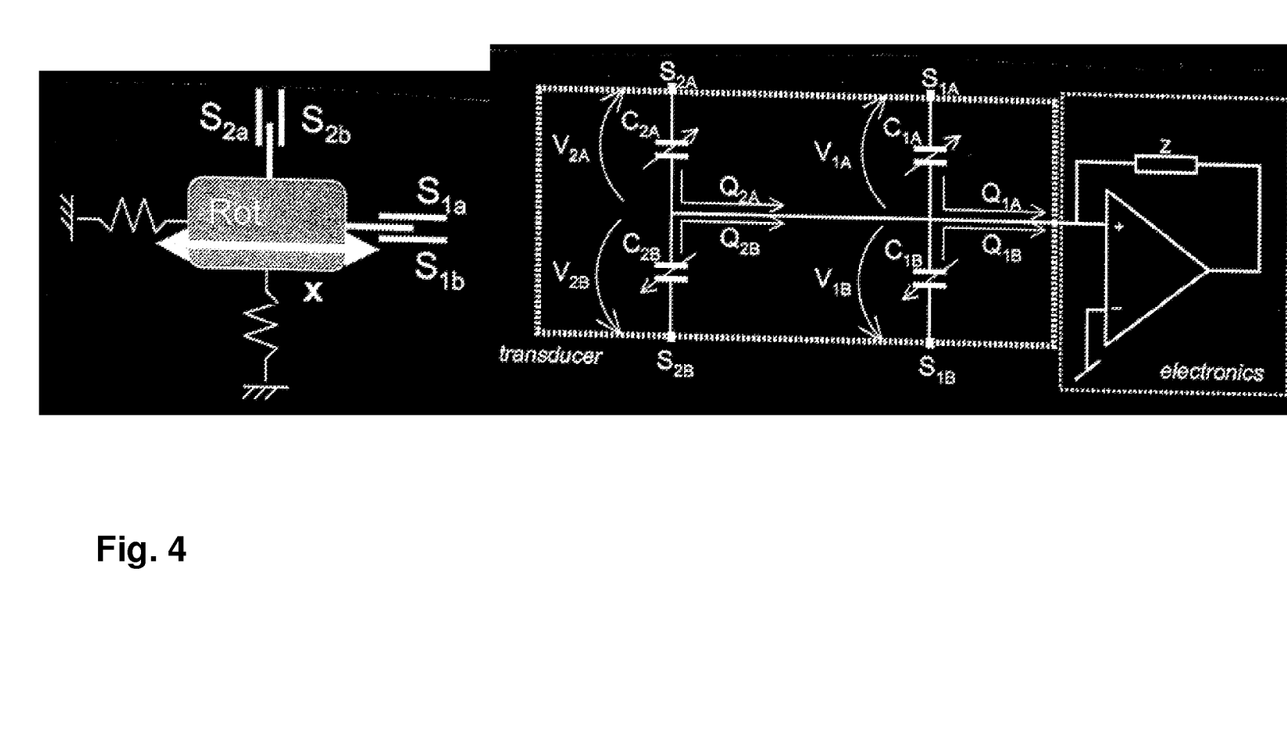
FIG. 4 is a depiction showing detection readout with quadrature signal compensation in conjunction with one embodiment.

FIG. 4 is a diagram shown a detection output with quadrature signal compensation in conjunction with an embodiment of the invention.

As follows from FIG. 4, in a compensated system:

$$C_{2a}=C_{0,2}+X_0*\sin(\omega t)$$

$$Q_{2a}=(C_{0,2}+X_0*\sin(\omega t))*V_{2a}$$

$$C_{1a}=C_0+\text{Quad}*\sin(\omega t)+\Omega*\cos(\omega t)$$

$$Q_{1a}=(C_0+\text{Quad}*\sin(\omega t)+\Omega*\cos(\omega t))*V_{1a}$$

$$C_{2b}=C_{0,2}-X_0*\sin(\omega t)$$

$$Q_{2b}=(C_{0,2}-X_0*\sin(\omega t))*V_{2b}$$

$$C_{1b}=C_0-\text{Quad}*\sin(\omega t)-\Omega*\cos(\omega t)$$

$$Q_{1b}=(C_0-\text{Quad}*\sin(\omega t)-\Omega*\cos(\omega t))*V_{2b}$$

$$Q_{tot}=Q_{1a}+Q_{1b}+Q_{2a}+Q_{2b}=C_0*V_{1a}+C_0*V_{1b}+C_{0,2}*V_{2a}+C_{0,2}*V_{2b}+\Omega*\cos(\omega t)*(V_{1a}-V_{1b})++\sin(\omega t)*(\text{Quad}*V_{1a}+X_0*V_{2a}-\text{Quad}*V_{1b}-X_0*V_{2b})$$

The quadrature signal is extinguished accordingly with an appropriate calibration:

$$V_{2a}=-V_{1a}*(\text{Quad}/X_0) \text{ and } V_{2b}=-V_{1b}*(\text{Quad}/X_0)$$

The signal on $V_{2a}$, $V_{2b}$ is the same as $V_{1a}$, $V_{1b}$ with the calibrated fraction.

$X_0$ is the capacitance deviation due to the drive movement.

The proposed solution requires an electrode capable of reading out the drive movement. This electrode can be
- an electrode prescribed for this purpose,
- the same electrode already present on the gyroscope for the drive control in order to detect the drive movement (SD),
- the same electrode already present on the gyroscope for the drive control in order to produce the drive movement (D).

The solution is applicable to 1x-, 2x- or 3x-gyroscopes. In multiple-axis gyroscopes each detection axis requires a different calibration voltage. The compensation signals can be applied to different electrodes (one for each detection axis) or to the same electrode for all axes (summing of the different compensation signals). If necessary, the solution is also applicable to sensors that detect linear accelerations in one or more directions. Here again movements of the drive masses can be compensated by corresponding signals that compensate for the quadrature error.

Figure 5:
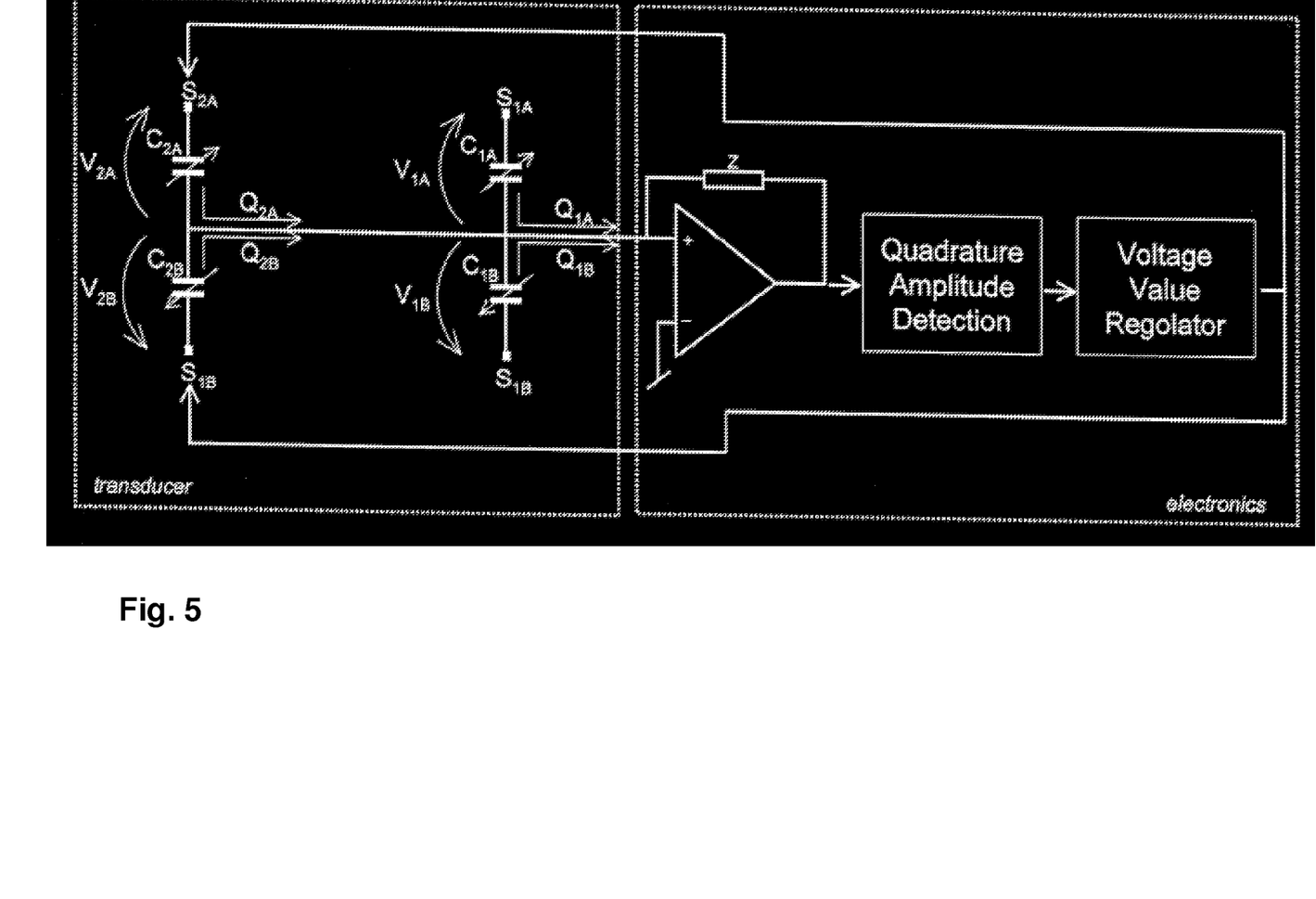
FIG. 5 is a depiction showing quadrature signal compensation with a closed control loop conjunction with an embodiment of the invention.

The compensation voltage can be altered during operation of the device in order to be able to control the quadrature error. In this case a quadrature error drift can also be compensated during the lifetime of the sensor. For this purpose, FIG. 5 shows a regulated quadrature signal compensation agreeing with one embodiment of the invention.

Whereas the present invention was described with reference to specific embodiments, it is self-evident to one skilled in the art that different changes can be made and equivalent features replaced without deviating from the scope of the present invention. Many modifications can also be made in order to adapt to a special situation or a special material without deviating from the instructions of the present invention. The intention is therefore that the present invention is not restricted to a particular depicted embodiment but that the present invention also includes all embodiments that fall within the scope of the corresponding claims.

We claim:

1. A method for compensating a quadrature error on a MEMS sensor, the method comprising:
   detecting a movement of a drive mass within the MEMS sensor, the movement of the drive mass being relative to drive electrodes and having a deviation from a prescribed movement due to a quadrature error;
   identifying a capacitance change as a function of drive movement of the drive mass using a compensation electrode;
   generating a compensation charge on the compensation electrode, the compensation charge being dependent on the quadrature error; and
   compensating the quadrature error using the compensation charge.

2. The method of claim 1 wherein the step of compensating the quadrature error is performed by canceling at least a portion of a quadrature error charge with the compensation charge.

3. The method of claim 1 wherein a predetermined voltage dependent on the quadrature error is applied to compensation electrodes to generate the compensation charge.

4. The method of claim 1 wherein the compensation charge and the capacitance change are processed relative to each during a process of compensating quadrature error.

5. The method of claim 1 wherein the compensation charge and the capacitance charge are provided to evaluation circuitry.

6. The method of claim 5 wherein the evaluation circuitry identifies a compensation process for compensating the quadrature error.

7. The method of claim 1 wherein the compensation charge is controlled based on the quadrature error.

8. The method of claim 1 wherein a voltage associated with the quadrature error is determined during a test operation of a MEMS sensor.

9. The method of claim 1 wherein the quadrature error is determined during real-time operation of a MEMS sensor.

10. A MEMS sensor for detecting movement, the sensor comprising:
    a substrate;
    detection circuitry positioned on the substrate, the detection circuitry detects a deflection of a mass caused at least in part to a quadrature error;
    capacitive sensor circuitry coupled to detect a capacitance change caused by the deflection of the mass; and
    compensation circuitry coupled to the capacitive sensor circuitry, the compensation circuitry generates a compensation signal that cancels at least a portion of error caused by the quadrature error.

11. The MEMS sensor of claim 10 wherein the detection circuitry comprises at least one detection electrode that detects a deflection of a mass.

12. The MEMS sensor of claim 11 wherein the deflection of the mass is caused by a Coriolis force and the quadrature error.

13. The MEMS sensor of claim 10 wherein the compensation circuitry comprises at least one compensation electrode.

14. The MEMS sensor of claim 13 wherein the at least one compensation electrode records a capacitance change as a function of a drive movement of a mass.

15. The MEMS sensor of claim 10 wherein the sensor detects rotation relative to at least two axes.

16. The MEMS sensor of claim 10 wherein the sensor detects acceleration along an axis.

17. The MEMS sensor of claim 10 further compnsmg evaluation circuitry that identifies a compensation process for compensating the quadrature error.

18. The MEMS sensor of claim 17 wherein the evaluation circuitry identifies a compensation charge that offsets at least a portion of the quadrature error.

* * * * *